United States Patent
Yamane

[11] Patent Number: 5,956,371
[45] Date of Patent: Sep. 21, 1999

[54] ADAPTIVE EQUALIZING FILTER OF REDUCED ELECTRIC POWER CONSUMPTION FOR USE IN COMMUNICATION SYSTEM

[75] Inventor: Hirotaka Yamane, Tokyo, Japan

[73] Assignee: NEC Corporation, Japan

[21] Appl. No.: 08/892,387

[22] Filed: Jul. 14, 1997

[30] Foreign Application Priority Data

Jul. 12, 1996 [JP] Japan .................................. 8-183095

[51] Int. Cl.[6] .................................................. H03H 7/30
[52] U.S. Cl. ...................................... 375/232; 364/724.2
[58] Field of Search .......................... 375/232; 364/724.2; 333/18, 28 R

[56] References Cited

U.S. PATENT DOCUMENTS

| | | |
|---|---|---|
| 4,247,940 | 1/1981 | Mueller et al. . |
| 5,363,411 | 11/1994 | Furuya et al. ............................ 375/316 |
| 5,455,819 | 10/1995 | Sugiyama ................................ 370/241 |
| 5,528,627 | 6/1996 | Yanagi et al. ............................ 375/232 |
| 5,636,151 | 6/1997 | Ikeda ................................... 364/724.19 |
| 5,657,349 | 8/1997 | Sugiyama ................................ 375/232 |
| 5,805,639 | 9/1998 | Tonch et al. ............................. 375/232 |

OTHER PUBLICATIONS

Werner, J.; "Tutorial on Carrierless AM/PM–Part I Fundamentals and Digital Cap TRansmitter"; Jun. 23, 1992; pp. 1–46 and Figures; Publication unknown; Communication to ANSI X3T9.5, TP/PMD Working Group, Minneapolis.

*Primary Examiner*—Temesghen Ghebretinsae
*Assistant Examiner*—Lenny Jiang
*Attorney, Agent, or Firm*—Hayes, Soloway, Hennessey, Grossman & Hage, P.C.

[57] ABSTRACT

In an adaptive equalizing transversal filter for quantizing a transmission waveform deformed because of communication line characteristics, a control circuit is provided for inhibiting the updating of mutiplication coefficients when an error signal between an equalized value and a quantized expected value is small, so as to omit the mutiplication operation required for obtaining the mutiplication coefficients, thereby reducing power consumption.

3 Claims, 2 Drawing Sheets

ADAPTIVE EQUALIZING FILTER OF REDUCED ELECTRIC POWER CONSUMPTION FOR USE IN COMMUNICATION SYSTEM

BACKGROUND

1. Field of the Invention

The present invention relates to an adaptive equalizing transversal filter of a reduced electric power consumption for use in communication system, and more specifically, to an adaptive equalizing transversal filter having reduced power consumption. Particular utility of the present invention is for use in communication system for equalizing a transmission waveform which is subject to deformity because of communication line characteristics, and other sources.

2. Description of Related Art

Referring to FIG. 1, there is shown a block diagram of one example of a prior art adaptive equalizing transversal filter. The shown adaptive equalizing transversal filter is of (N)th order. Data sampled and digitized by an analog-to-digital converter is supplied to an input "INPUT" of the transversal filter, which includes a number of delay circuits ("T") 1A, 1B, 1C, ..., 1L, 1M and 1N, which are cascaded as shown, and each of which is formed by, for example, a register. Each of the registers 1A, 1B, 1C, ..., 1L, 1M and 1N are driven by a clock not shown, so that in response to each clock signal, each of the registers 1A, 1B, 1C, ..., 1L, 1M and 1N latches an output of a preceding register. Therefore, the input signal is sequentially shifted through the registers 1A, 1B, 1C, ..., 1L, 1M and 1N. An output of each of the registers 1A, 1B, 1C, ..., 1L, 1M and 1N is connected to an input of an associated multiplier 2A, 2B, 2C, ..., 2L, 2M and 2N, which is also connected to receive an output of an associated multiplication coefficient generator ("Co") 3A, 3B, 3C, ..., 3L, 3M and 3N, so that the output of each register 1A, 1B, 1C, ..., 1L, 1M and 1N is multiplied with a coefficient outputted from the associated multiplication coefficient generator 3A, 3B, 3C, ..., 3L, 3M and 3N. Outputs of all the multipliers 2A, 2B, 2C, ..., 2L, 2M and 2N are supplied to an adder ("Σ") 4. An output of the adder 4 constitutes an output of the transversal filter, and is connected to a quantizing discriminator ("slicer") 5, so that the output of the adder 4 is quantized and allocated to an expected value "OUTPUT". The output of the adder 4 and the output of the quantizing discriminator 5 are supplied to a subtracter ("SUB") 6, which generates an error signal "ERROR" composed of a difference between the output of the adder 4 and the output of the quantizing discriminator 5. This error signal "ERROR" is supplied to each of the multiplication coefficient generators 3A, 3B, 3C, ..., 3L, 3M and 3N for respective order places of the transversal filter.

As shown in FIG. 2, each of the multiplication coefficient generators 3A, 3B, 3C, ..., 3L, 3M and 3N for determining the coefficients of the respective order places of the transversal filter, comprises a multiplier 8 receiving a signal f(k) from the register (1A, 1B, 1C, ..., 1L, 1M and 1N) of the corresponding order, the error signal "ERROR" and a given constant α, and a subtracter 9 receiving at a subtrahend input an output of the multiplier 8 and at a minuend input an output of a register ("T") 10 having an input connected to an output of the subtracter 9. Thus, the subtracter 9 subtracts the result of the multiplication of the signal f(k), the error signal "ERROR" and the given constant α, from the output of the register 10, namely, the output of the subtracter 9 before one timing (namely, one clock). The subtracter 9 outputs the result of the subtraction, as the multiplication coefficient, to the associated multiplier 2A, 2B, 2C, ..., ,2L, 2M and 2N.

By way of example, assume that the input signal "INPUT" is f(k) at a timing "k", and the order of the transversal filter is "m". Therefore, At the timing "k", the output of the register 1A becomes f(k), and the output of the register 1B becomes f(k−1). The output of the register 1M becomes f(k−(m−1)), and the output of the register 1N becomes f(k−m). In addition, assume that the multiplication coefficient of respective orders (namely, the output of respective multiplication coefficient generators 3A, 3B, 3C, ..., 3L, 3M and 3N) is "a(m, k)". Under this condition, an equalized signal g(k) outputted from the adder 4 is expressed as follows:

$$g(k) = \sum_{m=0}^{M} a(m, k - m) \cdot f(k - m)$$

This equalized signal g(k) is supplied to the quantizing discriminator 5, so that the equalized signal g(k) is quantized and allocated to the expected value which is here expressed by "s(k)". Accordingly, the error signal outputted from the subtracter 6, which is expressed by "e(k)", is expressed by e(k)=s(k)−g(k). In automatic adaptive equalizing, the circuit operates to minimize this error "e(k)".

For example, in FSLE (Fractionally Space Linear Equalizer), the multiplication coefficients of the transversal filer are automatically and sequentially updated in accordance with this error, for the purpose of minimizing the error. Accordingly, the updating sequence can be expressed by $$a(m, k+1) = a(m, k) - \alpha \times e(k) \times f(m, k)$$

Here, "α" is called a "step size", which is a fixed constant value as mentioned above.

As seen from the above, in the prior art adaptive transversal filter, the updating of the multiplication coefficients is executed at each clock pulse, and therefore, the multiplication of {α×e(k)×f(m, k)} is repeated at each clock pulse. However, the multiplication of {α×e(k)×f(m, k)} requires large power consumption, and therefore, the prior art adaptive transversal filter requires large power consumption.

For a general understanding, reference can be made to J. J. Werner, "TUTORIAL ON CARRIERLESS AM/PM-PART I-FUNDAMENTALS AND DIGITAL CAP TRANSMITTER", Communication to ANSI X3T9.5, TP/PMD Working Group, Minneapolis, Jun. 23, 1992 and U.S. Pat. No. 4,247,940, the contents of which are incorporated by reference in its entirety into this application. Werner's paper proposes to modify the CAP transmitter with a transversal filter. However, if the system was designed in accordance with Werner's paper, the system needs a large power supply, similar to the above mentioned prior art example, and in addition, becomes large in scale.

SUMMARY OF THE INVENTION

Accordingly, it is an object of the present invention to provide an adaptive equalizing transversal filter which has overcome the above mentioned defect of the conventional filter.

Another object of the present invention is to provide an adaptive equalizing transversal filter having a reduced power consumption.

The above and other objects of the present invention are achieved in accordance with the present invention by an adaptive equalizing transversal filter including a means for inhibiting the updating of multiplication coefficients when the error is small, thereby omit the multiplication required for obtaining the multiplication coefficients, thereby reducing the power consumption. Alternatively, in place of inhibiting the updating of multiplication coefficients, the present invention can be adapted to reduce the updating of multiplication coefficients.

The above and other objects, features and advantages of the present invention will be apparent from the following description of preferred embodiments of the invention with reference to the accompanying drawings.

DESCRIPTION OF THE PREFERRED EMBODIMENTS

Figure 1:
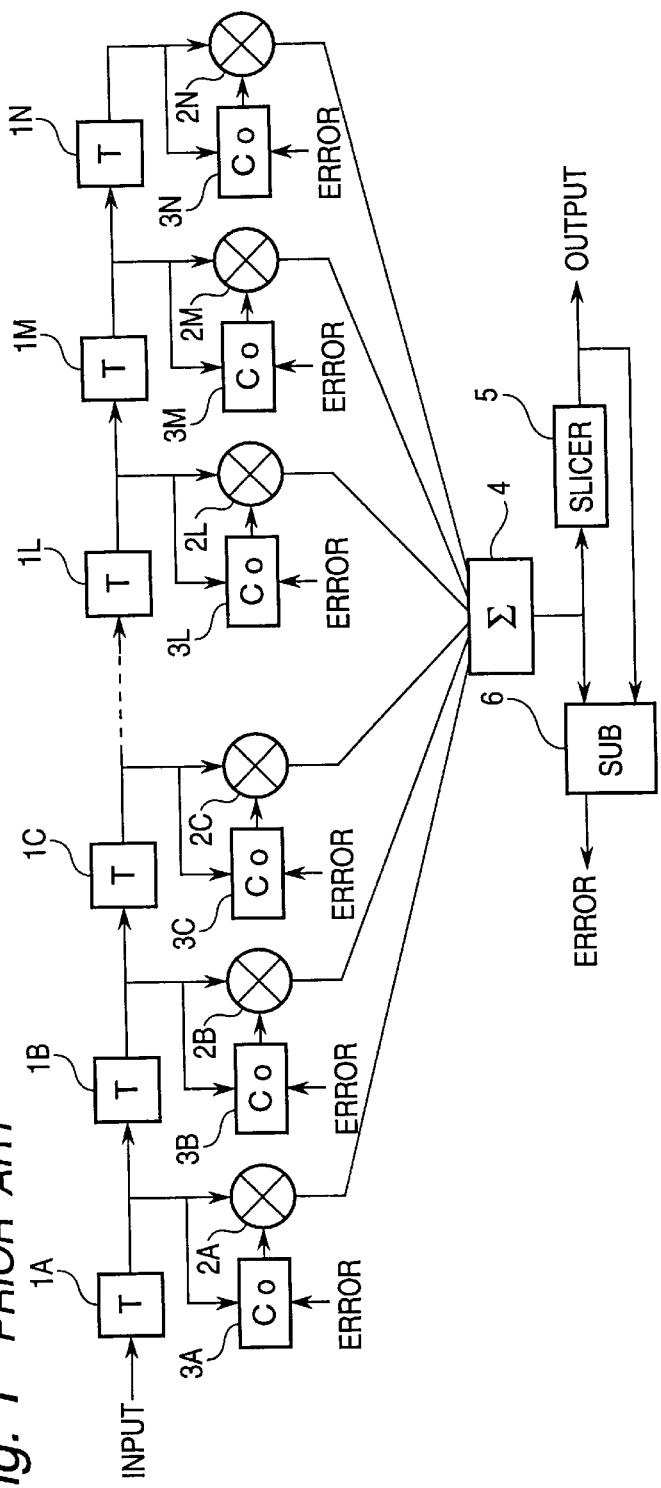
FIG. 1 is a block diagram of one example of a prior art adaptive equalizing transversal filter.
Figure 3:
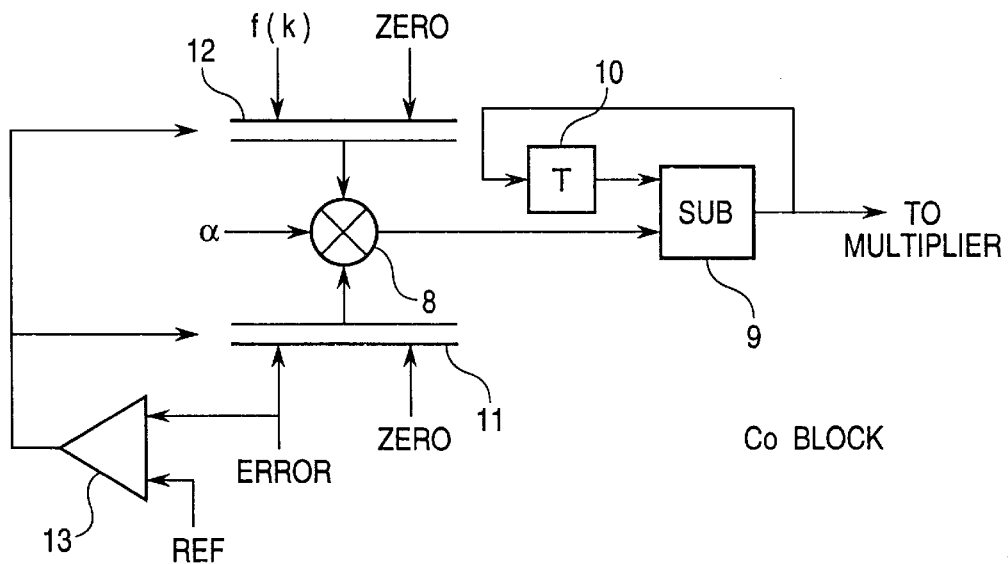
FIG. 3 is a block diagram of a first embodiment of the multiplication coefficient generator in accordance with the present invention, used in the adaptive equalizing transversal filter shown in FIG. 1.

Referring to FIG. 3, there is shown a block diagram of a first embodiment of the multiplication coefficient generator in accordance with the present invention, used in the adaptive equalizing transversal filter shown in FIG. 1.

Figure 2:
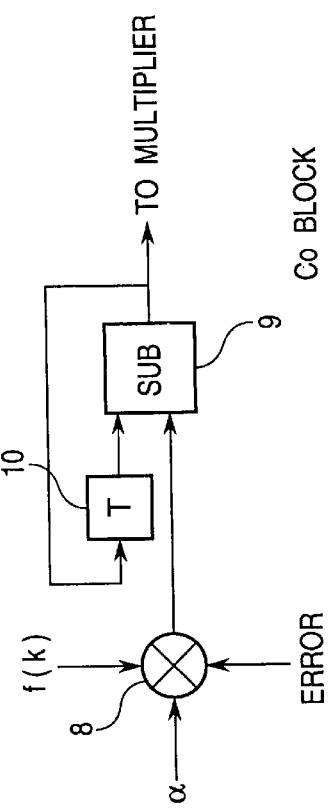
FIG. 2 is a block diagram of the multiplication coefficient generator used in the adaptive equalizing transversal filter shown in FIG. 1.

The first embodiment of the multiplication coefficient generator in accordance with the present invention includes the multiplier 8, the subtracter 9 and the register 10, similar to the prior art example shown in FIG. 2. In contrast to the prior art example shown in FIG. 2, the first embodiment of the multiplication coefficient generator includes a selector 11 having a pair of inputs receiving the error signal "ERROR" and a zero signal, respectively, and an output, connected to an input of the multiplier 8, and another selector 12 having a pair of inputs receiving the input signal f(k) and a zero signal, respectively, and an output connected to another input of the multiplier 8. A third input of the multiplier 8 is connected to receive a fixed constant value α. Furthermore, the first embodiment of the multiplication coefficient generator also includes a comparator 13 receiving and comparing the error signal "ERROR" and a reference voltage value REF. An output of the comparator 13 is supplied to respective control inputs of the two selectors 11 and 12. Thus, when the error signal "ERROR" is equal to or larger than the reference voltage value REF, the comparator 13 controls the two selectors 11 and 12 to select and output the error signal "ERROR" and the input signal f(k) to the multiplier 8, respectively. Therefore, when the error signal "ERROR" is not smaller than the reference voltage value REF, the first embodiment of the multiplication coefficient generator operates similarly to the prior art example shown in FIG. 2. On the other hand, when the error signal "ERROR" is smaller than the reference voltage value REF, the comparator 13 controls the two selectors 11 and 12 to select and output the zero signal "ZERO", respectively. As a result, the multiplier 8 outputs a fixed value "zero" to the subtracter 9.

By way of example, operation of the circuit shown in FIG. 3 is described below. As mentioned above, assuming that the input signal "INPUT" is f(k) at a timing "k" and the order of the transversal filter is "m", and also assuming that the multiplication coefficient of respective orders (namely, the output of respective multiplication coefficient generators 3A, 3B, 3C, . . . , 3L, 3M and 3N) is "a (m, k)", an equalized signal g(k) outputted from the adder 4 is expressed as follows:

$$g(k) = \sum_{m=0}^{M} a(m, k - m) \cdot f(k - m)$$

This equalized signal g(k) is supplied to the quantizing discriminator 5, so that the equalized signal g(k) is quantized and allocated to an expected value which expressed by "s(k)". Accordingly, the error "e(k)" between the expected value "s(k)" and the equalized signal g(k) is expressed by e(k)=s(k)−g(k). In an automatic adaptive equalizing, the circuit operates to minimize this error "e(k)". In addition, in FSLE (Fractionally Space Linear Equalizer), the multiplication coefficients of the transversal filer are automatically and sequentially updated in accordance with this error, for the purpose of minimizing the error. Accordingly, the updating sequence can be expressed by a(m, k+1)=a(m, k)−α×e(k)×f(m, k)

As mentioned hereinbefore, "α" is called a "step size", which is a fixed constant value as mentioned above.

In this first embodiment, as seen from the above, when the error signal "ERROR" is smaller than the reference voltage value REF, the comparator 13 controls the two selectors 11 and 12 to select and output the zero signal "ZERO", respectively. As a result, the multiplier 8 outputs a fixed value "zero" to the subtracter 9. Therefore, the multiplication of {α×e(k)×f(m, k)} can be omitted when the error signal "ERROR" is smaller than the reference voltage value REF. Accordingly, it becomes a(m, k+1)=a(m, k)

In order to omit the multiplication of {α×e(k)×f(m, k)}, a second order Booth's combinational multiplier is used as the multiplier, and when the error signal "ERROR" is smaller than the reference voltage value REF, the error signal "ERROR" is fixed to zero, in place of a(k). Under these conditions, multiplier 8 does not operate, and continues to output the zero. Accordingly, the power consumption is reduced.

In this first embodiment, when the error signal "ERROR" is smaller than the reference voltage value REF, multiplier 8 outputs zero, either of the selectors 11 and 12 can be omitted, so that either the input signal f(k) or the error signal "ERROR" is directly supplied to the multiplier 8.

Figure 4:
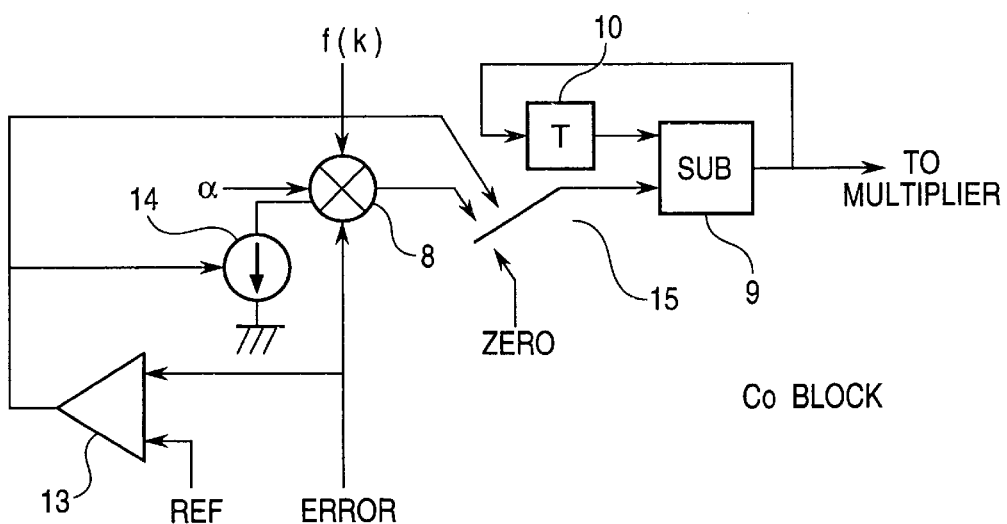
FIG. 4 is a block diagram of a second embodiment of the multiplication coefficient generator in accordance with the present invention, used in the adaptive equalizing transversal filter shown in FIG. 1.

Referring to FIG. 4, there is shown a block diagram of a second embodiment of the mutiplication coefficient generator in accordance with the present invention, used in the adaptive equalizing transversal filter shown in FIG. 1. In FIG. 4, elements corresponding to those shown in FIG. 3 are given the same Reference Numerals, and explanation thereof will be omitted for simplification of description.

The second embodiment includes a switch 15 in place of the selectors 11 and 12 of the first embodiment. This switch 15 has a first input connected to the output of the multiplier 8, a second input connected to a fixed value "0" (zero), and an output connected to the second (subtrahend) input of the subtracter 8. The output of the comparator 13 controls not only this switch 15 but also a current source 14 of the multiplier 8.

When the error signal "ERROR" is equal to or larger than the reference voltage value REF, the comparator 13 controls the switch 15 to cause the switch 15 to select the output of the multiplier 8, and also controls the current source 14 of the multiplier 8 so as to maintain the current source 14 of the multiplier 8 in an on condition so that the multiplier 8 is driven by the current source 14 to operate normally, namely to perform its multiplication operation. Accordingly, when the error signal "ERROR" is not smaller than the reference voltage value REF, the second embodiment of the multiplication coefficient generator operates similarly to the prior art example shown in FIG. 2. On the other hand, when the error signal "ERROR" is smaller than the reference voltage value REF, the comparator 13 controls the switch 15 to cause the switch 15 to select the fixed value "0" (zero), and also to turn off the current source 14 of the multiplier 8 so that the multiplier 8 no longer consumes power. Namely, the power consumption can be minimized to substantially zero. Since the subtracter 9 receives the fixed value "zero", the subtracter 9 outputs a(m, k+1)=a(m, k).

As seen from the above, in accordance with the present invention, the multiplication coefficient generators are controlled in such a manner that, when the equalizing operation is advanced so that the error has become sufficiently small, the multiplication coefficient generator no longer executes the multiplication operation (which requires large power consumption) which can be considered unnecessary since the error has become sufficiently small. Thus, reduced electric power consumption can be realized in the adaptive equalizing transversal filter, by making the degree of calculation precision of the multiplication coefficients variable or selectable.

The invention has thus been shown and described with reference to the specific embodiments. However, it should be noted that the present invention is in no way limited to the details of the illustrated structures but changes and modifications may be made within the scope of the appended claims.

I claim:

1. An adaptive equalizing transversal filter for quantizing a transmission waveform comprising:

a plurality of cascaded delay means, a first one of which is connected to receive an input signal;

a corresponding number of multiplying means each of which having a first input receiving an output of a corresponding one of said cascaded delay means, a second input and an output;

a corresponding number of multiplication coefficient generators each of which supplies a multiplication coefficient to said second input of a corresponding one of said multiplying means;

an adding means receiving said output of all said multiplying means for outputting an equalized value;

a quantizing discriminator receiving said equalized value for quantizing said equalized value to generate an expected value;

a subtracting means receiving said equalized value and said expected value for outputting a difference signal, as an error signal, to each of said multiplication coefficient generators, each of said multiplication coefficient generators including a subtracter having a first input, a second input and an output connected to said second input of a corresponding said multiplying means, a register having an input connected to said output of said subtracter and an output connected to said first input of said subtracter, and control means including a multiplier therein and receiving said error signal, said output of a corresponding one of said cascaded delay means, and a given constant value, an output of said control means being connected to said second input of said subtracter, said control means operating in such a manner that when said error signal is not smaller than a reference value, said control means outputs the result of the multiplication by said multiplier of said error signal, said output of said corresponding one of said cascaded delay means and said given constant value, to said second input of said subtracter, and when said error signal is smaller than said reference value, said control means outputs a fixed zero value to said second input of said subtracter, so that the multiplication is not performed by said multiplier.

2. An adaptive equalizing transversal filter claimed in claim 1 wherein said control means includes a first selector having a pair of inputs receiving said error signal and a zero signal, respectively, and an output connected to a first input of said multiplier, a second selector having a pair of inputs receiving said output of said corresponding one of said cascaded delay means and a zero signal, respectively, and an output connected to a second input of said multiplier, a third input of said multiplier being connected to receive said given constant value, and an output of said multiplier being connected to said second input of said subtracter, and a comparator receiving and comparing said error signal and said reference voltage value, and an output connected to a control input of each of said first and second selectors, said comparator operating in such a manner that when said error signal is not smaller than said reference voltage value, said comparator controls said first and second selectors to select and output said error signal and said output of said corresponding one of said cascaded delay means, respectively, so that the result of the multiplication by said multiplier of said error signal, said output of said corresponding one of said cascaded delay means, and said given constant value, to said second input of said subtracter, and when said error signal is smaller than said reference voltage value, said comparator controls said first and second selectors to select and output said zero signal, respectively, so that said multiplier outputs a fixed zero value to said subtracter, the multiplication is not performed by said multiplier.

3. An adaptive equalizing transversal filter claimed in claim 1 wherein said multiplier has a first input receiving said error signal, a second input receiving said output of said corresponding one of said cascaded delay means, a third input receiving said given constant value, said multiplier also including a current source supplying a necessary driving current to said multiplier, and wherein said control means further includes a switch having a first input connected to a output of said multiplier, a second input connected to a fixed zero value, and an output connected to said second input of said subtracter, and a comparator receiving and comparing said error signal and a reference voltage value, and an output of said comparator connected to a control input of each of said switch and said current source of said multiplier, said comparator operating in such a manner that when said error signal is not smaller than said reference voltage value, said comparator controls said current source of said multiplier so as to maintain said current source of said multiplier in an on condition so that said multiplier performs its multiplication operation, and also said comparator controls said switch to select and output said output of said multiplier, so that the result of the multiplication by said multiplier of said error signal, said output of said corresponding one of said cascaded delay means, and said given constant value, to said second input of said subtracter, and when said error signal is smaller than said reference voltage value, said comparator controls said switch to cause said switch to select said fixed zero value and also turns off said current source of said multiplier so that said multiplier no longer consumes electric power, and said subtracter receives the fixed zero value and therefore, maintains its output without modification.

* * * * *